US008674607B2

(12) United States Patent
Iizuka

(10) Patent No.: US 8,674,607 B2
(45) Date of Patent: Mar. 18, 2014

(54) PLASMA PROCESSING APPARATUS AND PROCESSING GAS SUPPLY STRUCTURE THEREOF

(75) Inventor: Hachishiro Iizuka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 340 days.

(21) Appl. No.: 13/115,193

(22) Filed: May 25, 2011

(65) Prior Publication Data

US 2011/0291568 A1   Dec. 1, 2011

Related U.S. Application Data

(60) Provisional application No. 61/354,285, filed on Jun. 14, 2010.

(30) Foreign Application Priority Data

May 26, 2010 (JP) .................... 2010-120242
May 2, 2011 (JP) .................... 2011-102749

(51) Int. Cl.
*H01J 7/24* (2006.01)

(52) U.S. Cl.
USPC ............ 315/111.21; 315/111.11; 315/111.01; 315/111.41; 315/111.51; 118/723 AN; 118/723 I; 118/715

(58) Field of Classification Search
USPC .................. 315/111.21; 219/121, 121.36; 156/345.48
See application file for complete search history.

(56) References Cited

U.S. PATENT DOCUMENTS

| 5,522,934 | A | 6/1996 | Suzuki et al. |
| 7,740,738 | B2 * | 6/2010 | Kim et al. ............... 156/345.48 |
| 8,021,515 | B2 * | 9/2011 | Colpo et al. ............. 156/345.48 |
| 8,114,246 | B2 * | 2/2012 | Ni et al. ................... 156/345.48 |
| 8,216,421 | B2 * | 7/2012 | Nishida et al. ........... 156/345.48 |
| 8,267,042 | B2 * | 9/2012 | Ishibashi ............... 118/723 MW |
| 8,367,966 | B2 * | 2/2013 | Takahashi et al. ....... 219/121.52 |
| 8,377,209 | B2 * | 2/2013 | White .......................... 118/718 |
| 8,415,885 | B2 * | 4/2013 | Yamazawa ............... 315/111.51 |
| 2007/0044915 | A1 * | 3/2007 | Ni et al. ................... 156/345.42 |
| 2009/0130335 | A1 | 5/2009 | Okumura et al. |
| 2009/0291563 | A1 * | 11/2009 | Ishibashi ...................... 438/710 |

FOREIGN PATENT DOCUMENTS

| CN | 101258786 A | 9/2008 |
| EP | 1227172 A2 | 7/2002 |
| JP | 09-186140 A | 7/1997 |
| JP | 2001-085413 A | 3/2001 |
| JP | 3845154 B2 | 8/2006 |

* cited by examiner

*Primary Examiner* — Daniel Cavallari
*Assistant Examiner* — Srinivas Sathiraju
(74) *Attorney, Agent, or Firm* — Pearne & Gordon LLP

(57) ABSTRACT

There is provided a plasma processing apparatus for generating inductively coupled plasma in a processing chamber and performing a process on a substrate accommodated in the processing chamber. The plasma processing apparatus includes an upper cover installed to cover a top opening of the processing chamber and having a dielectric window; a high frequency coil installed above the dielectric window at an outer side of the processing chamber; a gas supply mechanism supported by the upper cover and installed under the dielectric window. Here, the gas supply mechanism includes a layered body including plates having through holes. Further, the gas supply mechanism is configured to supply a processing gas into the processing chamber in a horizontal direction via groove-shaped gas channels installed between the plates or between the plate and the dielectric window, and end portions of the groove-shaped gas channels are opened to edges of the through holes.

7 Claims, 14 Drawing Sheets

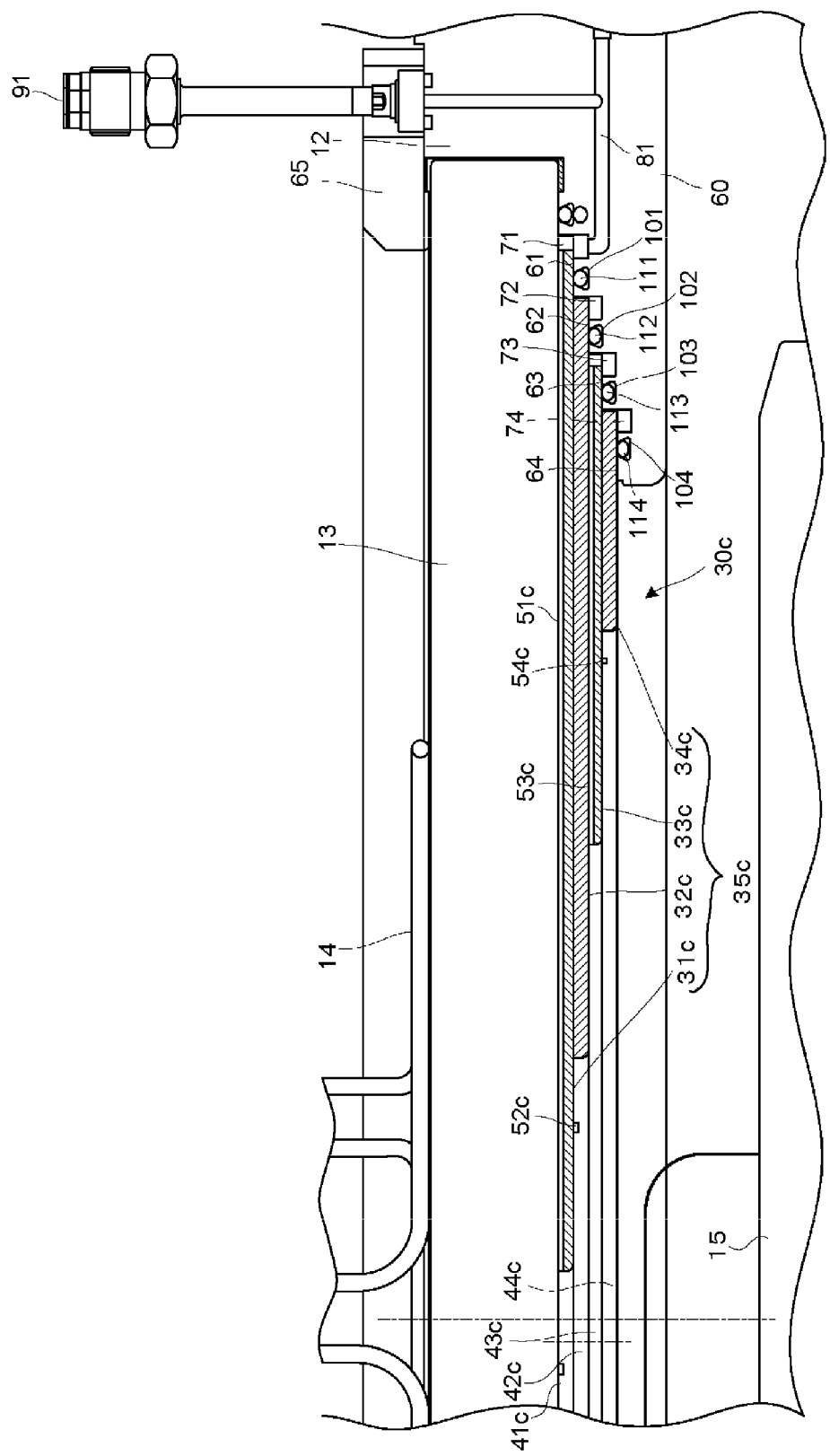

PLASMA PROCESSING APPARATUS AND PROCESSING GAS SUPPLY STRUCTURE THEREOF

CROSS-REFERENCE TO RELATED APPLICATION

This application claims the benefit of Japanese Patent Application Nos. 2010-120242 and 2011-102749 filed on May 26, 2010 and May 2, 2011, respectively, and U.S. Provisional Application Ser. No. 61/354,285 filed on Jun. 14, 2010, the entire disclosures of which are incorporated herein by reference.

FIELD OF THE INVENTION

The present invention relates to a plasma processing apparatus and a processing gas supply structure thereof.

BACKGROUND OF THE INVENTION

Conventionally, in a semiconductor device manufacturing field, there is known a plasma processing apparatus using inductively coupled plasma (ICP) as an apparatus for performing a process such as a film forming process or an etching process on a substrate such as a semiconductor wafer.

As for a processing gas supply structure of a plasma processing apparatus using ICP, in a plasma processing apparatus having a high frequency coil installed above a processing chamber, there is known a structure, for example, in which a processing gas supply mechanism including an annular hollow pipe is provided in a space between a high frequency coil and a substrate, and a processing gas is introduced into a space above the substrate from a multiple number of gas discharge openings formed at the inner side of the hollow pipe (see, e.g., Patent Document 1).

Further, in a plasma processing apparatus having a high frequency coil installed at a sidewall of a processing chamber, there is known a structure, for example, in which a processing gas is discharged from an upper center of the processing chamber to a space above a substrate (see, e.g., Patent Document 2).

All the above-described processing gas supply structures are of a type using a nozzle shape structure having openings such as holes or slits. In case of the plasma processing apparatus having the high frequency coil installed above the processing chamber, if there exists a large structure for introducing a gas to above the substrate, a processing state of the substrate may become non-uniform because the substrate is blocked by the large structure. Further, in case that a gas diffusion space is installed between the substrate and the high frequency coil, a means to prevent an electric discharge in this space is needed. For this reason, an area for discharging the gas is basically limited to a central area and an outer peripheral area of the substrate.

Patent Document 1: Japanese Patent Laid-open Publication No. 2001-85413
Patent Document 2: Japanese Patent No. 3845154

As described above, in the conventional plasma processing apparatus and the processing gas supply structure thereof, since the area for discharging the gas is limited, it is difficult to improve processing uniformity within a wafer surface by controlling a supply state of the processing gas.

BRIEF SUMMARY OF THE INVENTION

In view of the foregoing, the present invention provides a plasma processing apparatus and a processing gas supply structure thereof, capable of improving processing uniformity in a wafer surface as compared to a conventional case.

In accordance with one aspect of the present disclosure, there is provided a plasma processing apparatus for generating inductively coupled plasma in a processing chamber and performing a process on a substrate accommodated in the processing chamber. The plasma processing apparatus includes an upper cover installed to cover a top opening of the processing chamber and having a dielectric window; a high frequency coil installed above the dielectric window at an outer side of the processing chamber; a gas supply mechanism supported by the upper cover and installed under the dielectric window. Here, the gas supply mechanism may include a layered body including a multiple number of plates having through holes. Further, the gas supply mechanism may be configured to supply a processing gas into the processing chamber in a horizontal direction from a multiple number of ports via a multiple number of groove-shaped gas channels installed between the plates or between the plate and the dielectric window, and end portions of the groove-shaped gas channels may be opened to edges of the through holes.

In accordance with another aspect of the present disclosure, there is provided a processing gas supply structure of a plasma processing apparatus including an upper cover installed to cover a top opening of a processing chamber and having a dielectric window and a high frequency coil installed above the dielectric window at an outer side of the processing chamber and capable of generating inductively coupled plasma in the processing chamber by applying a high frequency power to the high frequency coil and performing a process on a substrate accommodated in the processing chamber. The processing gas supply structure includes a layered body supported by the upper cover and installed under the dielectric window and including a multiple number of plates having through holes. Here, a processing gas may be supplied into the processing chamber in a horizontal direction from a multiple number of ports via a multiple number of groove-shaped gas channels installed between the plates or between the plate and the dielectric window, and end portions of the groove-shaped gas channels may be opened to edges of the through holes.

In accordance with the present invention, it is possible to provide a plasma processing apparatus and a processing gas supply structure thereof, capable of improving processing uniformity in a surface as compared to a conventional case.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 8 is an enlarged longitudinal cross sectional view showing a configuration of major parts of the plasma etching apparatus of FIGS. 7A and 7B.

DETAILED DESCRIPTION OF THE INVENTION

Hereinafter, the embodiments of the present invention will be described with reference to the accompanying drawings.

Figure 1A:
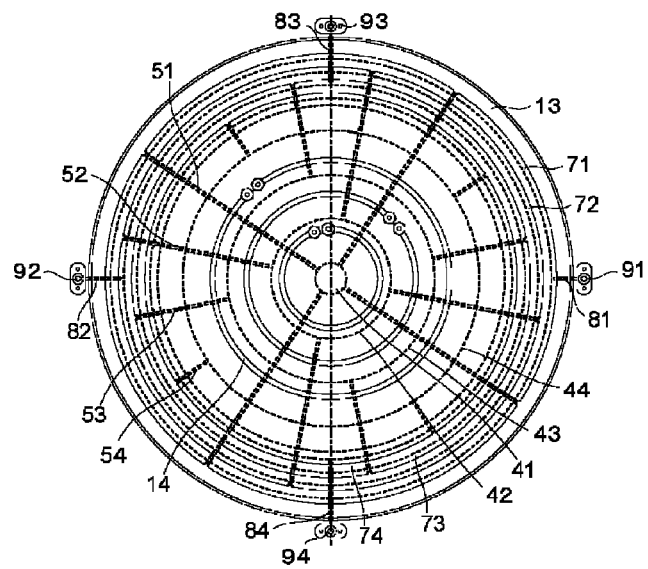
FIGS. 1A and 1B illustrate a configuration of a plasma etching apparatus in accordance with a first embodiment of the present invention.
Figure 1B:
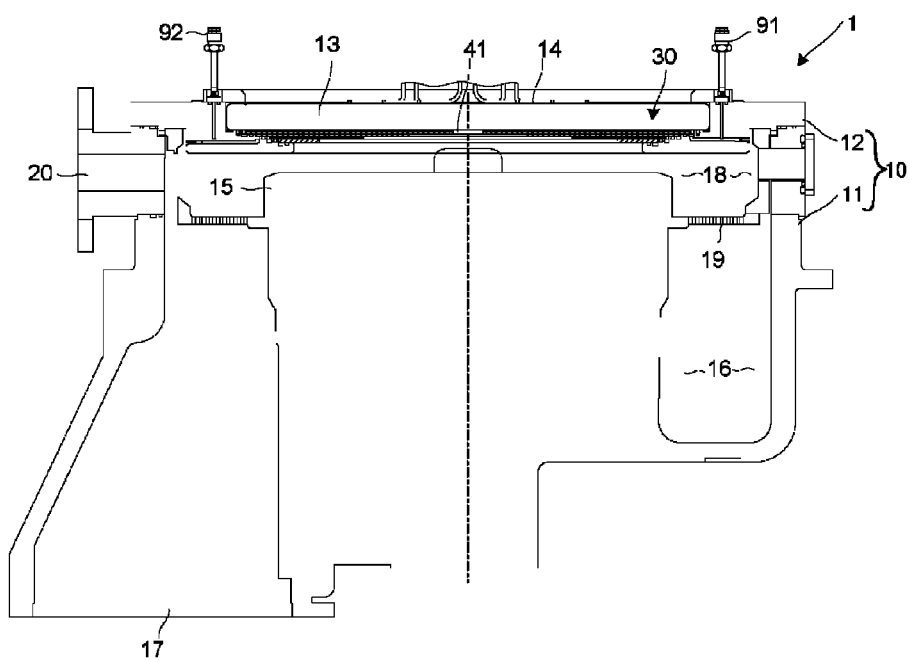

FIGS. 1A and 1B illustrate a schematic configuration of a plasma etching apparatus 1 as a plasma processing apparatus in accordance with a first embodiment of the present invention. As shown in these drawings, the plasma processing apparatus 1 includes a processing chamber 10. The processing chamber 10 may have a substantially cylindrical shape and may be made of, e.g., aluminum whose surface is anodically oxidized. Further, the processing chamber 10 includes a main body 11 having an opening in a top portion thereof and an upper cover 12 disposed to cover the opening at the upper portion of the main body 11.

A dielectric window 13 made of quartz or the like is installed at the upper cover 12, and a high frequency coil 14 is installed so as to be located near an upper portion of the dielectric window 13 at an outer side of the processing chamber 10. The high frequency coil 14 is connected to a high frequency power supply (not shown) and a high frequency power having a predetermined frequency (e.g., about 13.56 MHz) is supplied thereto.

In the processing chamber 10, a mounting table 15 for mounting a substrate such as a semiconductor wafer is installed below the dielectric window 13. An electrostatic chuck or the like (not shown) for attracting and holding the substrate is installed on a substrate mounting surface of the mounting table 15. Further, connected to this mounting table is a high frequency power supply (not shown) for bias voltage application. An annular gas exhaust space 16 for exhausting a gas downward is formed around the mounting table 15, and a gas exhaust port 17 communicating with a gas exhaust unit (not shown) is formed in the gas exhaust space 16.

Installed around the mounting table 15 is a baffle plate 19 for partitioning a processing space 18 above the mounting table 15 and the gas exhaust space 16. Further, a loading/unloading port 20 for loading and unloading a substrate to be processed is formed at a sidewall of the main body 11. An opening/closing mechanism (not shown) such as a gate valve is installed at the loading/unloading port 20.

Under the dielectric window 13, a processing gas supply mechanism 30 is installed. The processing gas supply mechanism 30 is made of a layered body 35 having a multiple number of (in the present embodiment, four) plates 31 to 34, as shown in an enlarged view of FIG. 2. Through holes 41 to 44 are formed at central portions of the plates 31 to 34, respectively. The plates 31 to 34 have an annular shape when viewed as a whole. Diameters of the through holes 41 to 44 (inner diameters of the annular plates 31 to 34) are decreased as the through holes 41 to 44 become closer to a side of the dielectric window 13 (upper side of FIG. 2). Meanwhile, outer diameters of the plates 31 to 34 are increased as the plates 31 to 34 become closer to a side of the dielectric window 13 (upper side of FIG. 2).

The plates 31 to 34 are made of a dielectric material such as quartz or ceramics. The thickness of the plates 31 to 34 may be equal to or larger than about 3 mm, e.g., about 6 mm. A groove is formed on a top surface of the plate 31 from an outer peripheral portion to an inner end portion thereof in a diametric direction, and a groove-shaped gas channel 51 is formed between the dielectric window 13 and the plate 31 by this groove. Further, for example, a groove is also formed on a top surface of the plate 33 from an outer peripheral portion to an inner end portion thereof in a diametric direction, and a groove-shaped gas channel 53 is formed between the plate 32 and the plate 33 by this groove. That is, by layering the plates 31 to 34 having a multiple number of grooves formed on top surfaces thereof in a diametric direction, groove-shaped gas channels 51 to 54 are formed between the plates 31 to 34 and between the dielectric window 13 and the plate 31.

Figure 2:
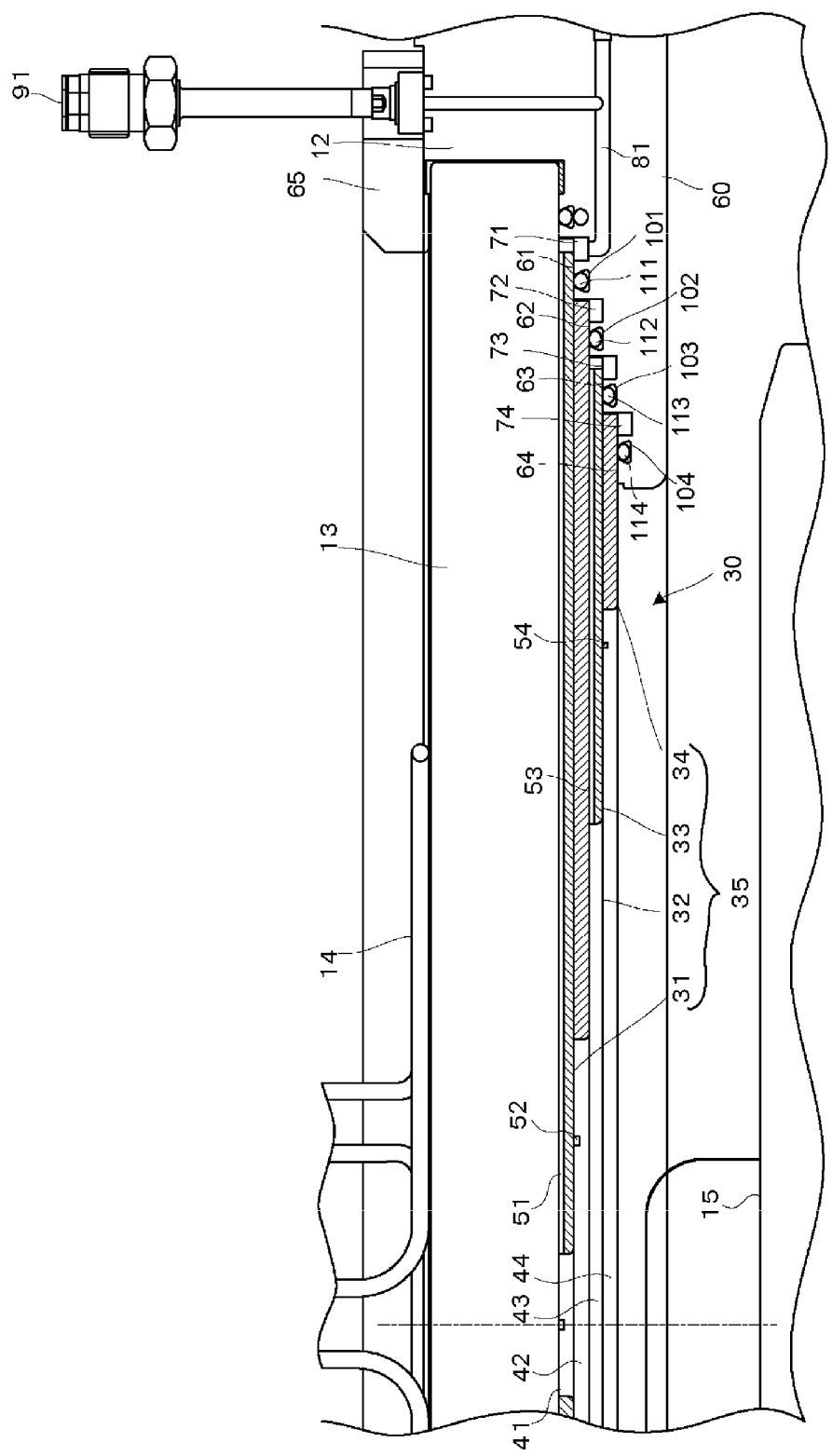
FIG. 2 is an enlarged longitudinal cross sectional view showing a configuration of major parts of the plasma etching apparatus of FIGS. 1A and 1B.

Furthermore, in FIG. 2, for the simplicity of illustration, there are shown the grooves formed in the diametrical direction such as the groove-shaped gas channels and 53, but these grooves are actually located at different longitudinal cross sections, as shown in FIG. 1A. Further, as for a groove-shaped gas channel 52 formed between the plate 31 and the plate 32 and a groove-shaped gas channel 54 formed between the plate 33 and the plate 34, only openings at leading end portions thereof are shown in FIG. 2.

As illustrated in FIG. 1A, as for each of the groove-shaped gas channels 51 to 54, a multiple number of gas channels (four (4) for each and a total of sixteen (16) in the example shown in FIG. 1A) are formed in a circumferential direction at a same interval without being overlapped. Each of these groove-shaped gas channels 51 to 54 is formed to be perpendicular to the annular high frequency coil 14 in order to prevent an electric discharge from occurring in the groove-shaped gas channels 51 to 54 by an electromagnetic field induced by the high frequency coil 14. Further, the grooves for forming these groove-shaped gas channels 51 to 54 may have a depth of, e.g., about 1 mm to 2 mm.

As shown in FIG. 2, bottom surfaces of peripheral portions of the plates 31 to 34 are supported by a support 60 installed at an inner portion of the upper cover 12. The support 60 has supporting surfaces 61 to 64 formed in a step shape according to the outer diameters of the plates 31 to 34, respectively, and annular grooves 71 to 74 are formed at outer end portions of the supporting surfaces 61 to 64 along a circumferential direction. These annular grooves 71 to 74 serve as gas channels for supplying a processing gas along a circumferential direction of the plates 31 to 34.

As shown in FIG. 2, a processing gas inlet path 81 extended outward from the annular groove 71 is connected to a predetermined portion of the annular groove 71, and the processing gas inlet path 81 communicates with a processing gas inlet unit 91. Only the processing gas inlet path 81 and the processing gas inlet unit 91 are shown in FIG. 2, but processing gas inlet paths 82 to 84 and processing gas inlet units 92 to 94 are also installed for the other annular grooves 72 to 74 as shown in FIG. 1A. Moreover, the groove forming the groove-shaped gas channel 51, the processing gas inlet path 81 and the processing gas inlet unit 91 are shown in FIG. 2 for the simplicity of illustration, but they are actually installed so as to be located at different longitudinal cross sections.

As illustrated in FIG. 2, O-ring grooves 101 to 104 are formed at inner sides of the annular grooves 71 to 74, and O-rings 111 to 114 for airtight sealing are disposed in these O-ring grooves 101 to 104.

In order to fix the plates 31 to 34, the plate 34 is mounted on the supporting surface 64; the plate 33 is mounted on the supporting surface 63; the plate 32 is mounted on the supporting surface 62; and the plate 31 is mounted on the supporting surface 61. Then, the dielectric window 13 is mounted on the plate 31, and an annular pressing member 65 is fastened to the upper cover 12 by a bolt or the like, and the vicinity of the dielectric window 13 can be pressed downward. Further, it is also possible to fix the plates 31 to 34 in advance by diffusion joint or the like.

In the processing gas supply mechanism 30 configured as described above, the processing gas introduced from the processing gas inlet units 91 to 94 is supplied via the processing gas inlet paths 81 to 84, the annular grooves 71 to 74 and the groove-shaped gas channels 51 to 54 into the processing chamber 10 in a horizontal direction from the through holes 41 to 44 to which the groove-shaped gas channels 51 to 54 are opened.

In accordance with this processing gas supply mechanism 30, since there is not provided a gas diffusion space near the high frequency coil 14, a means to prevent an electric discharge in the gas diffusion space is not required. Furthermore, since the layered structure of the plates 31 to 34 made of the dielectric members is provided, discharge positions of the processing gas may not be limited to a central area and a peripheral area of a substrate but can be set to any positions in a diametrical direction of the substrate. Hence, the processing gas can be uniformly supplied into the processing space 18 above the substrate and processing uniformity in a wafer surface can be improved. Moreover, if required, the processing gas can be non-uniformly supplied into the processing space 18 and a plasma processing state can be controlled arbitrarily. In addition, since there exists the processing gas supply mechanism 30 of the layered structure, a shape of the processing space becomes a protruded shape when viewed from the substrate. Hence, as compared to a case where this layered structure is not provided, processing characteristics of the peripheral area of the substrate may be changed.

The groove-shaped gas channels 51 to 54 are installed so as to be perpendicular to the high frequency coil 14. Accordingly, possibility of occurrence of electric discharge in the groove-shaped gas channels 51 to 54 is low. However, in order to surely prevent the occurrence of the electric discharge in the groove-shaped gas channels 51 to 54, a metal film may be installed at the groove-shaped gas channels 51 to 54 and the metal film may be set to a ground potential or another potential.

When a plasma etching is performed on a semiconductor wafer by the plasma etching apparatus 1 configured as described above, a substrate is loaded into the processing chamber 10 from the loading/unloading port 20 after the opening/closing mechanism (not shown) is opened. Then, the substrate is mounted on the mounting table 15 and is attracted and held by the electrostatic chuck.

Then, the opening/closing mechanism (not shown) of the loading/unloading port 20 is closed, and the inside of the processing chamber 10 is evacuated to a predetermined vacuum level through the gas exhaust port 17 by a vacuum pump (not shown).

Thereafter, a processing gas (etching gas) of a certain flow rate is supplied into the processing chamber 10 by the processing gas supply mechanism 30. At this time, the processing gas introduced from the processing gas inlet units 91 to 94 is supplied via the processing gas inlet paths 81 to 84, the annular grooves 71 to 74 and the groove-shaped gas channels 51 to 54 into the processing chamber 10 in a horizontal direction from the through holes 41 to 44 to which the groove-shaped gas channels 51 to 54 are opened.

Then, after the inside of the processing chamber 10 is maintained at a predetermined pressure, a high frequency power of a predetermined frequency is applied to the high frequency coil 14. Accordingly, in the processing space 18 above the substrate in the processing chamber 10, ICP plasma of the etching gas is generated. Further, when necessary, a high frequency bias voltage is applied from a high frequency power supply (not shown) to the mounting table 15, so that a plasma etching of the substrate by the ICP plasma is performed.

At this time, since the processing gas is supplied from a multiple number of distributed positions in the processing chamber 10 by the processing gas supply mechanism 30, the processing gas can be more uniformly supplied to the substrate. Further, since the processing gas supply mechanism 30 is formed of the layered body 35 having the plates 31 to 34 made of the dielectric members and is formed as one body with the dielectric window 13, an electromagnetic field induced into the processing space via the dielectric window 13 is blocked, so that a non-uniform processing state on the substrate can be suppressed. Accordingly, a plasma state becomes stable, so that a uniform etching process can be performed on each area of the substrate. That is, processing uniformity in the wafer surface can be improved.

If the plasma etching process is finished, the application of the high frequency power and the supply of the processing gas are stopped, and the substrate is unloaded from the processing chamber 10 in the order reverse to that described above.

Figure 3A:
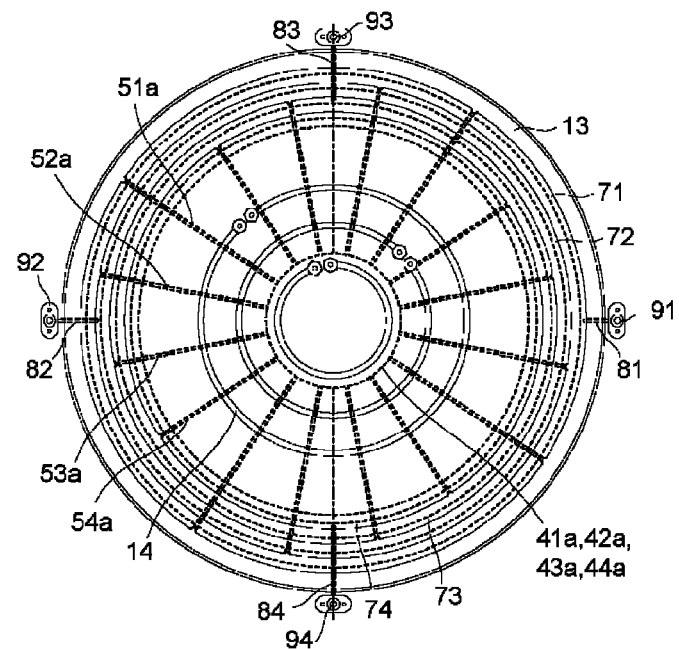
FIGS. 3A and 3B illustrate a configuration of a plasma etching apparatus in accordance with a second embodiment of the present invention.
Figure 3B:
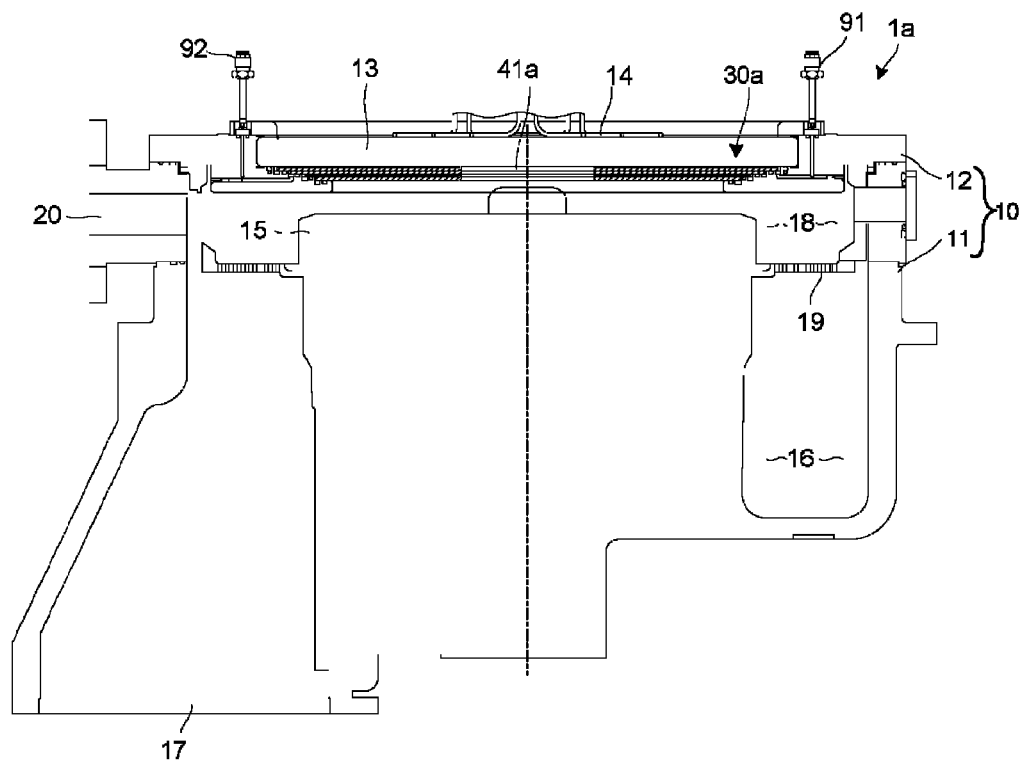

Hereinafter, referring to FIGS. 3A to 4, a plasma etching apparatus 1a in accordance with a second embodiment will be described. The second embodiment is different from the first embodiment in that the processing gas supply mechanism 30 of the first embodiment is modified to a processing gas supply mechanism 30a.

Figure 4:
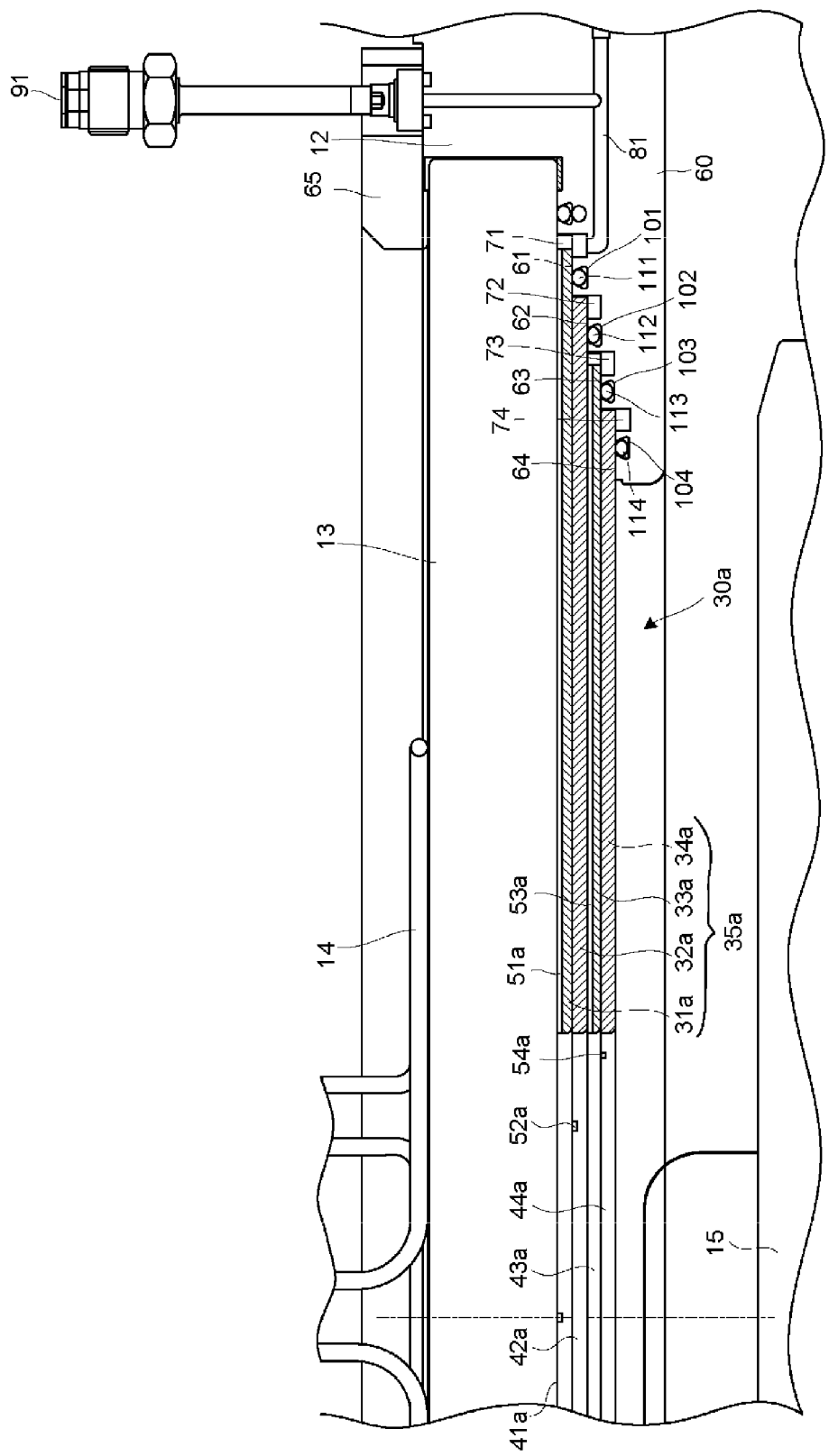
FIG. 4 is an enlarged longitudinal cross sectional view showing a configuration of major parts of the plasma etching apparatus of FIGS. 3A and 3B.

As shown in FIG. 4, in the second embodiment, the processing gas supply mechanism 30a is made of a layered body 35a including plates 31a to 34a made of a dielectric material. The plates 31a to 34a have annular shapes, and through holes 41a to 44a formed at central portions of the plates 31a to 34a have same inner diameters. Further, as shown in FIG. 3A, groove-shaped gas channels 51a to 54a formed by grooves provided in the plates 31a to 34a are arranged at a same interval in a circumferential direction, and the groove-shaped gas channels 51a to 54a are formed at positions spaced apart from each other in a circumferential direction.

In the above-described second embodiment, the inner diameters of the through holes 41a to 44a are substantially same, and processing gas discharge openings at ends of the groove-shaped gas channels 51a to 54a are arranged on a same circumference. Further, these positions of the processing gas discharge openings in a diametric direction are not limited to a central area or a peripheral area but may be any positions. Further, the positions of the processing gas discharge openings in a circumferential direction are different and spaced apart from each other, and heights of the processing gas discharge openings of the groove-shaped gas channels 51a to 54a are spaced apart from each other depending on thicknesses of the plates 31a to 34a. Accordingly, as in the first embodiment, the processing gas supplied to the substrate can be more uniformized, so that a uniform etching can be performed on each area of the substrate. Furthermore, since configurations other than that described above are the same as those of the first embodiment, like reference numerals will be given to corresponding parts and redundant description thereof will be omitted.

Then, referring to FIGS. 5A to 6, a plasma etching apparatus 1b in accordance with a third embodiment will be described. The third embodiment is different from the first embodiment in that the processing gas supply mechanism 30 of the first embodiment is modified to a processing gas supply mechanism 30b.

Figure 5A:
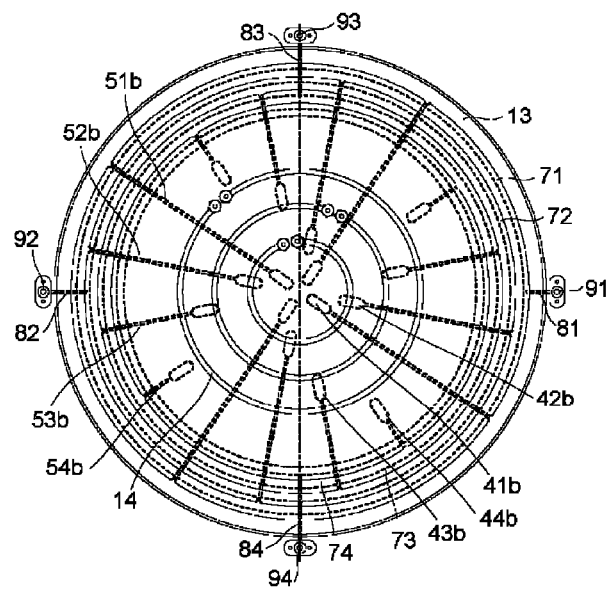
FIGS. 5A and 5B illustrate a configuration of a plasma etching apparatus in accordance with a third embodiment of the present invention.
Figure 6:
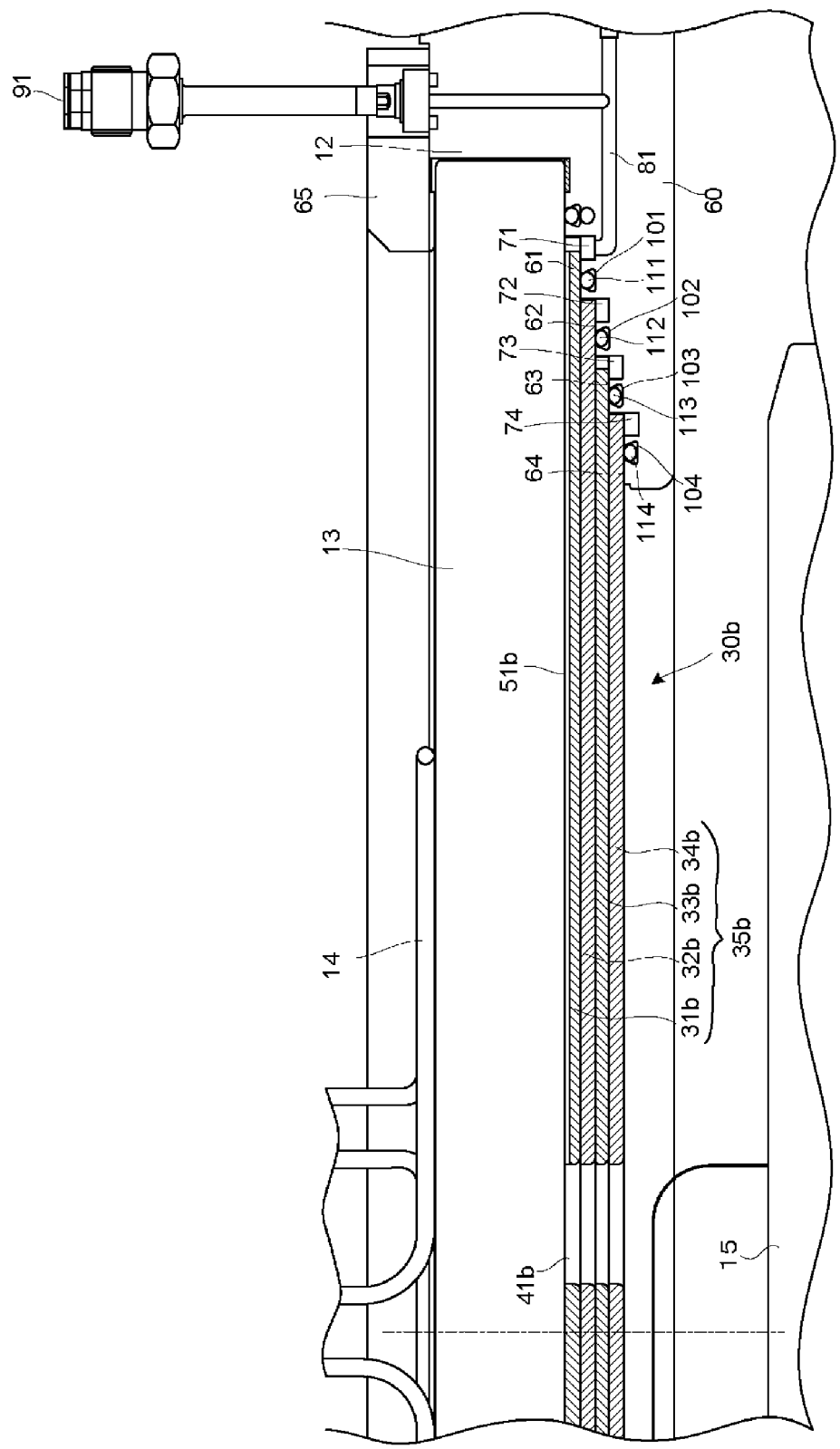
FIG. 6 is an enlarged longitudinal cross sectional view showing a configuration of major parts of the plasma etching apparatus of FIGS. 5A and 5B.

As shown in FIG. 6, in the third embodiment, the processing gas supply mechanism 30b is made of a layered body 35b including plates 31b to 34b made of a dielectric material. A total of four through holes 41b are formed at a central portion of the plate 31b on the side of a dielectric window 13 (upper side of FIG. 6) (see FIG. 5A), and same through holes are also formed at same positions in the plates 32b to 34b which are closer to the side of a mounting table 15 than the plate 31b.

Figure 5B:
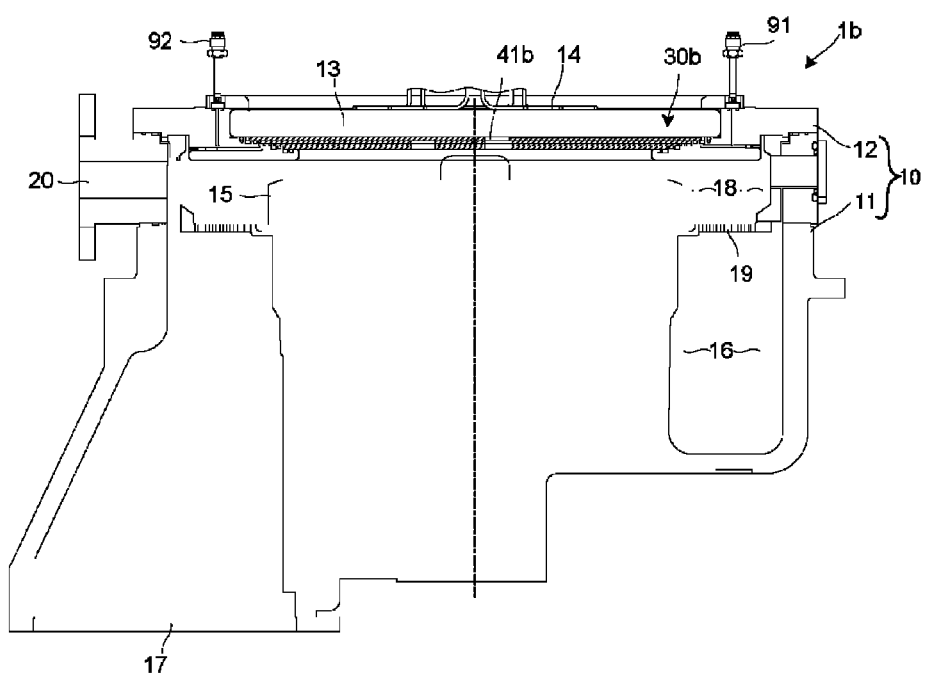

Furthermore, as shown in FIG. 5A, four through holes 42b are formed in the plate 32b to be located at an outer side than the through hole 41b, and same through holes are formed at same positions in the plates 33b and 34b which are closer to the side of the mounting table 15 than the plate 32b. Furthermore, four through holes 43b are formed in the plate 33b to be located at an outer side than the through holes 42b, and same through holes are formed at same positions in the plate 34b which is closer to the side of the mounting table 15 than the plate 33b. Further, four through holes 44b are formed in the plate 34b to be located at an outer side than the through holes 43b.

As in the above-described third embodiment, the plates 31b to 34b may have shapes other than an annular shape. The through holes 41b to 44b may be formed at positions serving as processing gas discharge openings, and ends of groove-shaped gas channels 51b to 54b may be opened to sidewall of the through holes 41b to 44b. Further, since configurations other than that described above are the same as those of the first embodiment, like reference numerals will be given to corresponding parts and redundant description thereof will be omitted.

Figure 7A:
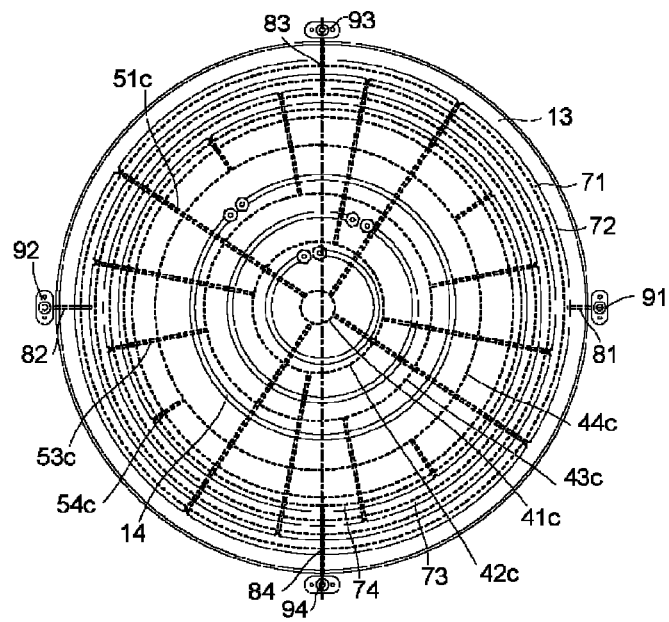
FIGS. 7A and 7B illustrate a configuration of a plasma etching apparatus in accordance with a fourth embodiment of the present invention.
Figure 7B:
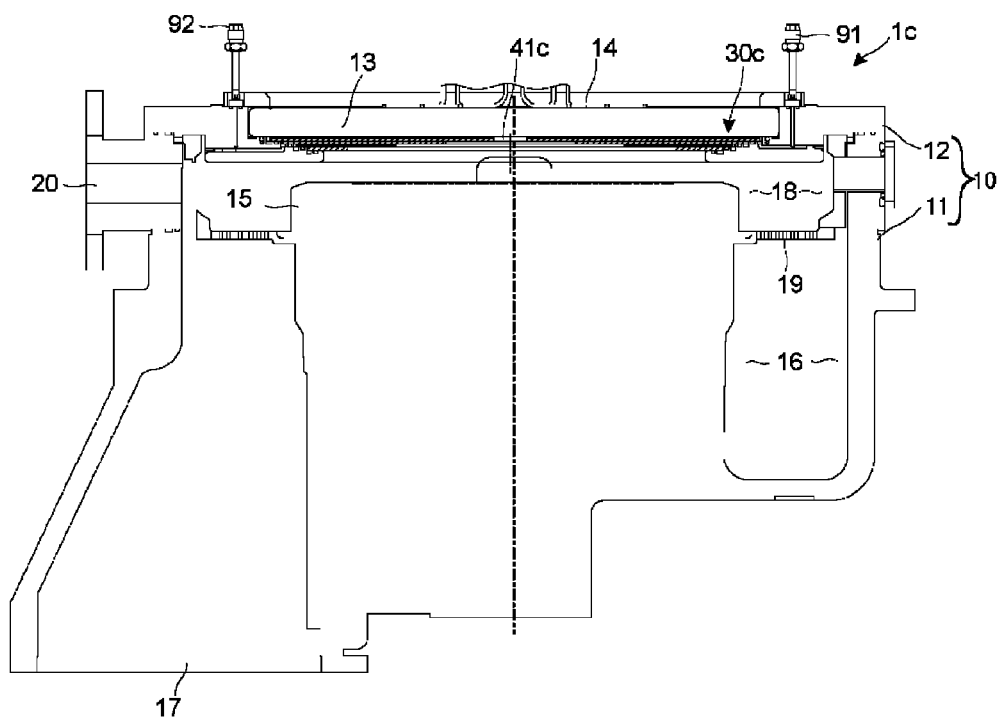

Referring to FIGS. 7A to 8, a plasma etching apparatus 1c in accordance with a fourth embodiment will be described. The fourth embodiment is different from the first embodiment in that the processing gas supply mechanism 30 of the first embodiment is modified to a processing gas supply mechanism 30c.

As shown in FIG. 8, in the fourth embodiment, the processing gas supply mechanism 30c is made of a layered body 35c including plates 31c to 34c made of a dielectric material. The plates 31c to 34c are formed in annular shapes as in the first embodiment, but, as shown in FIG. 7a, the fourth embodiment are different from the first embodiment in that a center of the layered body 35c is located at an eccentric position from a center of a dielectric window 13. As in the fourth embodiment, it is possible to install the processing gas supply mechanism 30c within the processing chamber 10 so as to be eccentric from the center of a processing chamber 10 while a processing gas supply port is also disposed eccentrically. Furthermore, since configurations other than that described above are the same as those of the first embodiment, like reference numerals will be given to corresponding parts and redundant description thereof will be omitted.

Hereinafter, referring to FIGS. 9A to 13, a processing gas supply mechanism 30d and a plasma processing apparatus 1d in accordance with a fifth embodiment will be described. Further, like reference numerals will be given to parts corresponding to those described in the first embodiment, and redundant description thereof will be omitted.

Figure 9A:
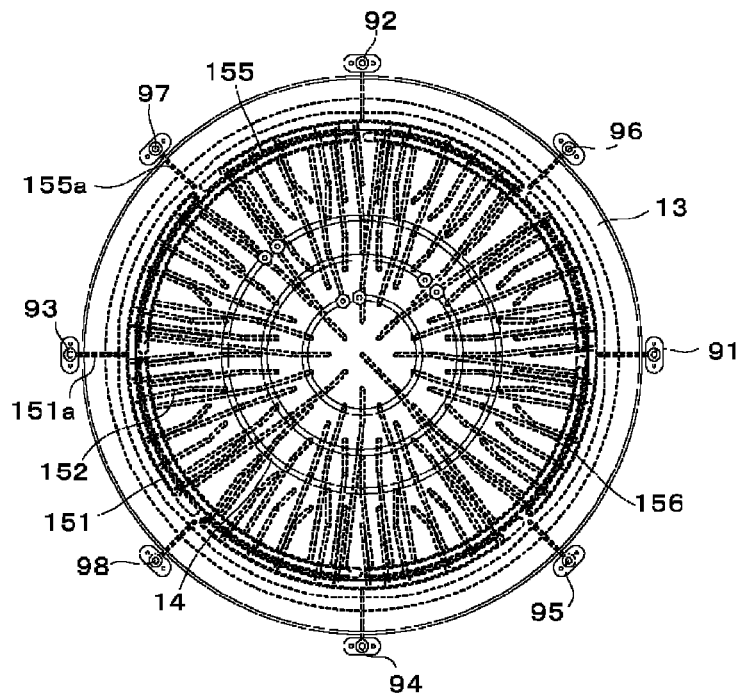
FIGS. 9A and 9B illustrate a configuration of a plasma etching apparatus in accordance with a fifth embodiment of the present invention.
Figure 9B:
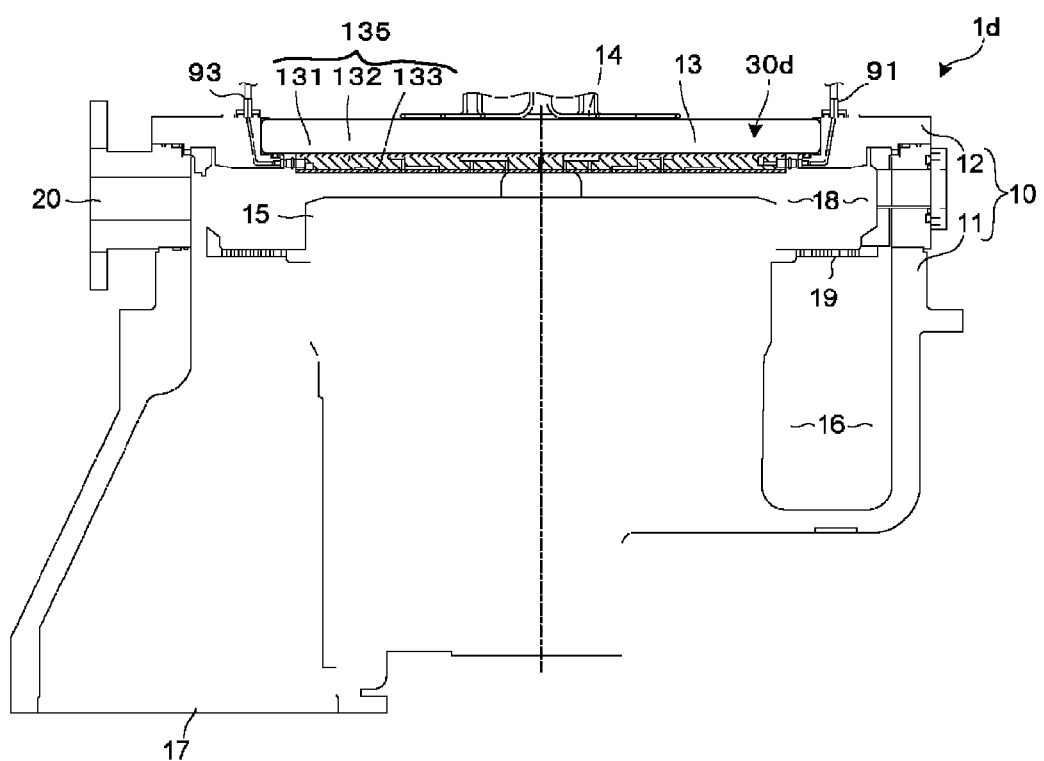

FIGS. 9A and 9B illustrate a configuration of major parts of the plasma processing apparatus 1d in accordance with the fifth embodiment. As shown in FIG. 9B, the processing gas supply mechanism 30d in accordance with the fifth embodiment includes a layered body 135 having three plates including an upper plate 131, an intermediate plate 132 and a lower plate 133 made of a dielectric material (quarts in the fifth embodiment) such as quartz, single crystalline silicon, ceramics or the like. Each of the upper plate 131, the intermediate plate 132 and the lower plate 133 has a substantially circular plate shape, and the entire thickness thereof is, e.g., about 15 mm. The intermediate plate 132 located at the middle of the three plates has a thickness larger than those of the upper plate 131 and the lower plate 133, e.g., about 11 mm. Further, thickness of the upper plate 131 and the lower plate 133 is about 2 mm.

Figure 10:
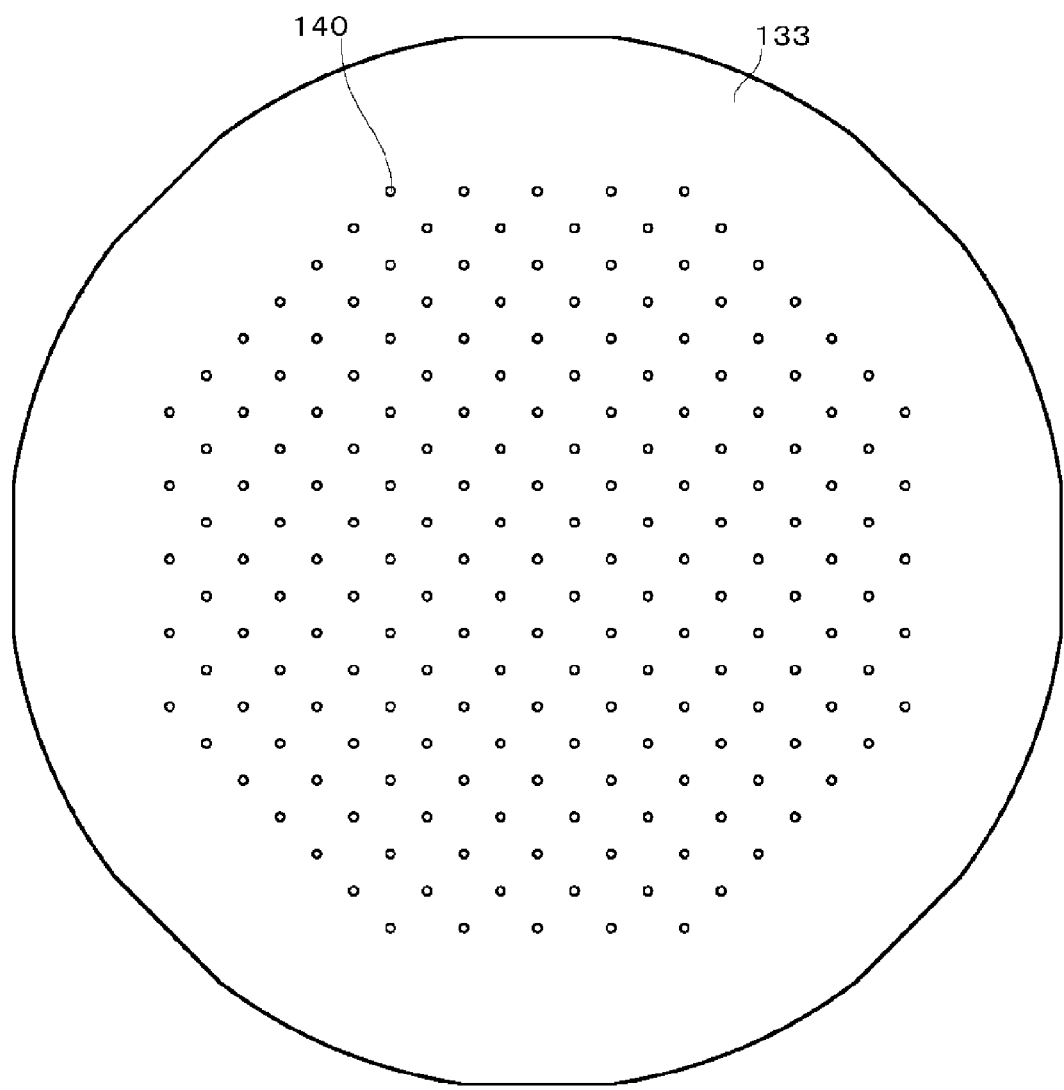
FIG. 10 is an enlarged longitudinal cross sectional view showing a configuration of major parts of the plasma etching apparatus of FIGS. 9A and 9B.
Figure 11:
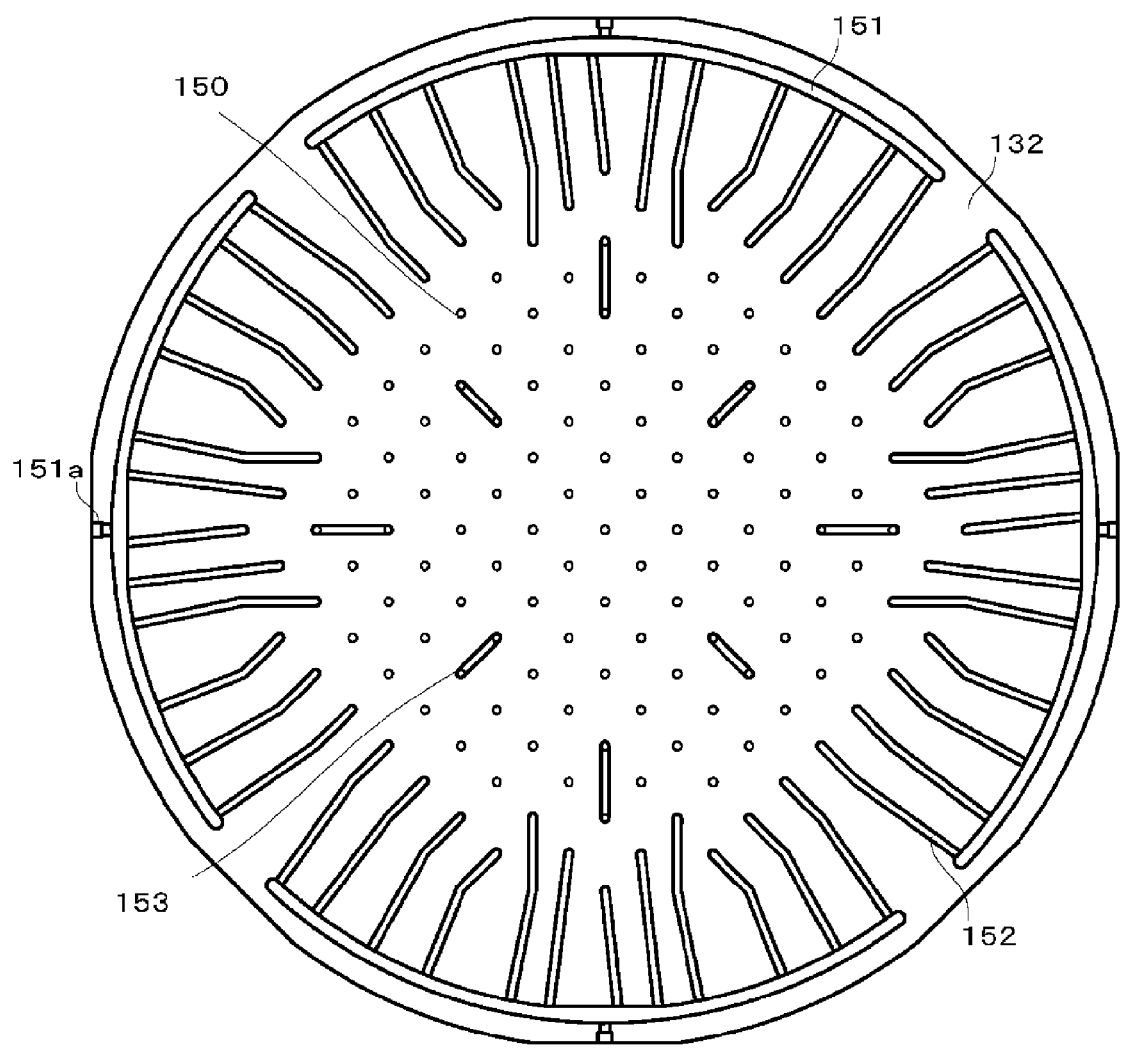
FIG. 11 illustrates a configuration of major parts of the plasma etching apparatus of FIGS. 9A and 9B.

As shown in FIG. 10, a multiple number of lower through holes 140 are formed at the lower plate 133, and in the present embodiment, the lower through holes 140 are arranged in a lattice shape. Moreover, as shown in FIG. 11, a multiple number of intermediate through holes 150 are formed at an inner area of the intermediate plate 132. Further, as illustrated in FIG. 11, on the bottom surface of the intermediate plate 132, a multiple number of lower peripheral grooves 151, lower diametrical grooves 152 and lower auxiliary grooves 153 are provided to form an outer peripheral gas channel for supplying the processing gas to an outer peripheral area of the substrate.

The lower peripheral grooves 151 are divided to four grooves of a circular arc shape and arranged along an outer circumference of the intermediate plate 132. A processing gas inlet port 151a for supplying the processing gas to the outer peripheral area of the substrate is installed for each of the four lower peripheral grooves 151. Further, the lower diametrical grooves 152 are extended in a diametrical direction from the lower peripheral grooves 151 toward an inner side. The lower diametrical groove 152 is formed such that an inner end thereof reaches an edge of any one of the lower through holes 140 formed at the lower plate 133 shown in FIG. 10. When the lower plate 133 and the intermediate plate 132 are attached to each other, the lower diametrical grooves 152 communicate with the lower through holes 140.

Further, the lower auxiliary grooves 153 are formed so as to connect the intermediate through holes 150. The lower auxiliary groove 153 is formed to communicate with an upper diametrical groove 156 formed on a top surface of the intermediate plate 132 to be described later through one intermediate through hole 150. The lower auxiliary grooves 153 are provided to form a bypass gas channel toward the bottom surface of the intermediate plate 132 for an area where an upper diametrical groove 156 cannot be formed on the top surface of the intermediate plate 132 due to interference with other upper diametrical grooves 156.

Figure 12:
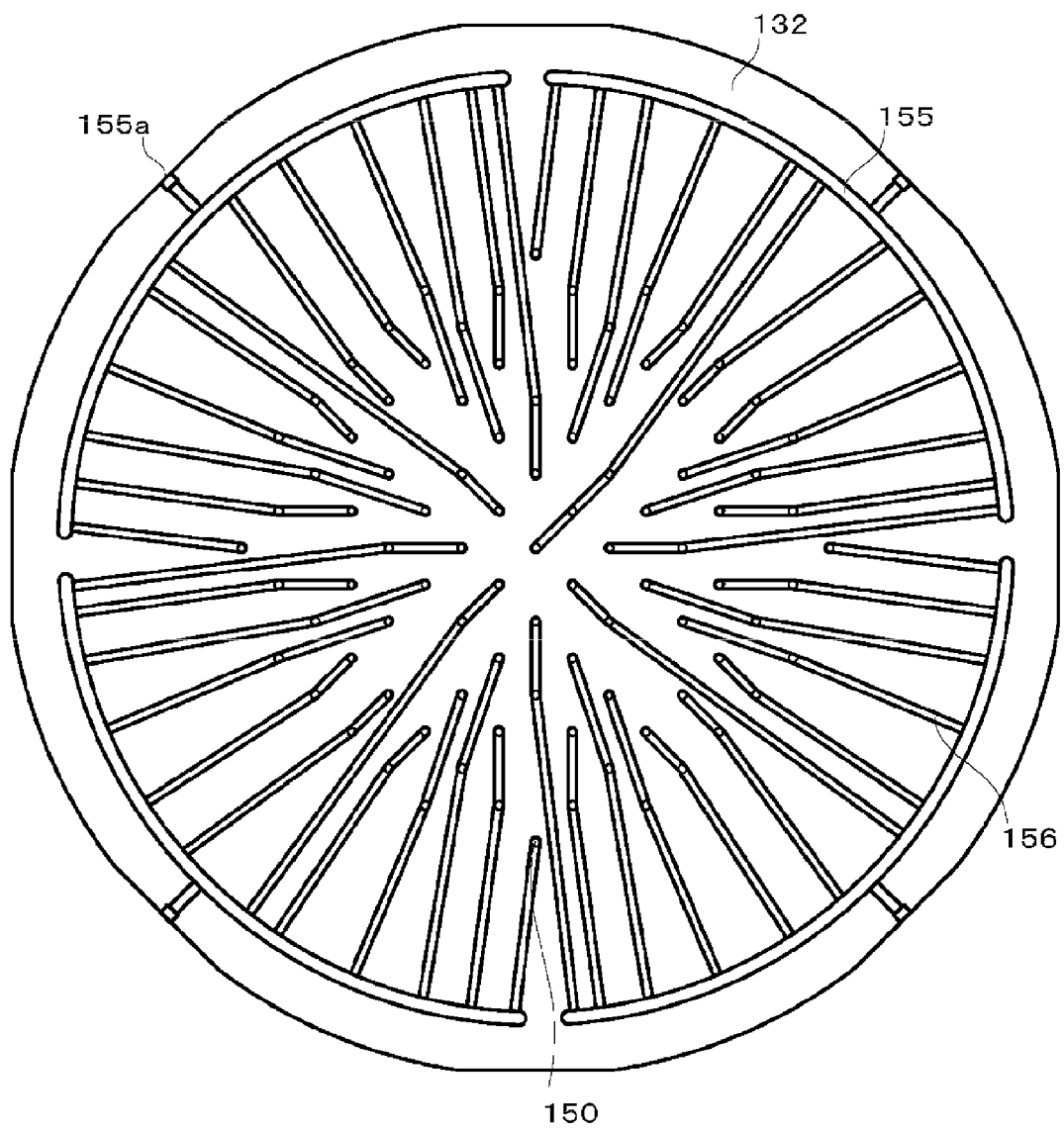
FIG. 12 illustrates a configuration of major parts of the plasma etching apparatus of FIGS. 9A and 9B.

As shown in FIG. 12, formed on the top surface of the intermediate plate 132 are a multiple number of upper diametrical grooves 156 and upper peripheral grooves 155 for forming an inner gas channel for supplying the processing gas toward an inner area of the substrate. The upper peripheral grooves 155 are divided to four grooves of a circular arc shape and arranged along an outer circumference of the intermediate plate 132. Further, the upper diametrical grooves 156 are extended in a diametrical direction from the upper peripheral grooves 155 toward an inner side. The upper diametrical groove 156 is formed such that an inner end thereof reaches an edge of any one of the intermediate through holes 150, and the upper diametrical groove 156 and the intermediate through hole 150 communicate with each other. Furthermore, a part of the upper diametrical grooves 156 may include some intermediate through holes 150 on a path thereof as well as one intermediate through hole 150 at the inner end thereof. That is, the upper diametrical grooves 156 and the intermediate through holes 150 are not in one-to-one correspondence, and one upper diametrical groove 156 may communicate with a multiple number of intermediate through holes 150. For each of the upper peripheral grooves 155, a processing gas inlet port 155a for supplying the processing gas to the inner area of the substrate is formed.

Figure 13:
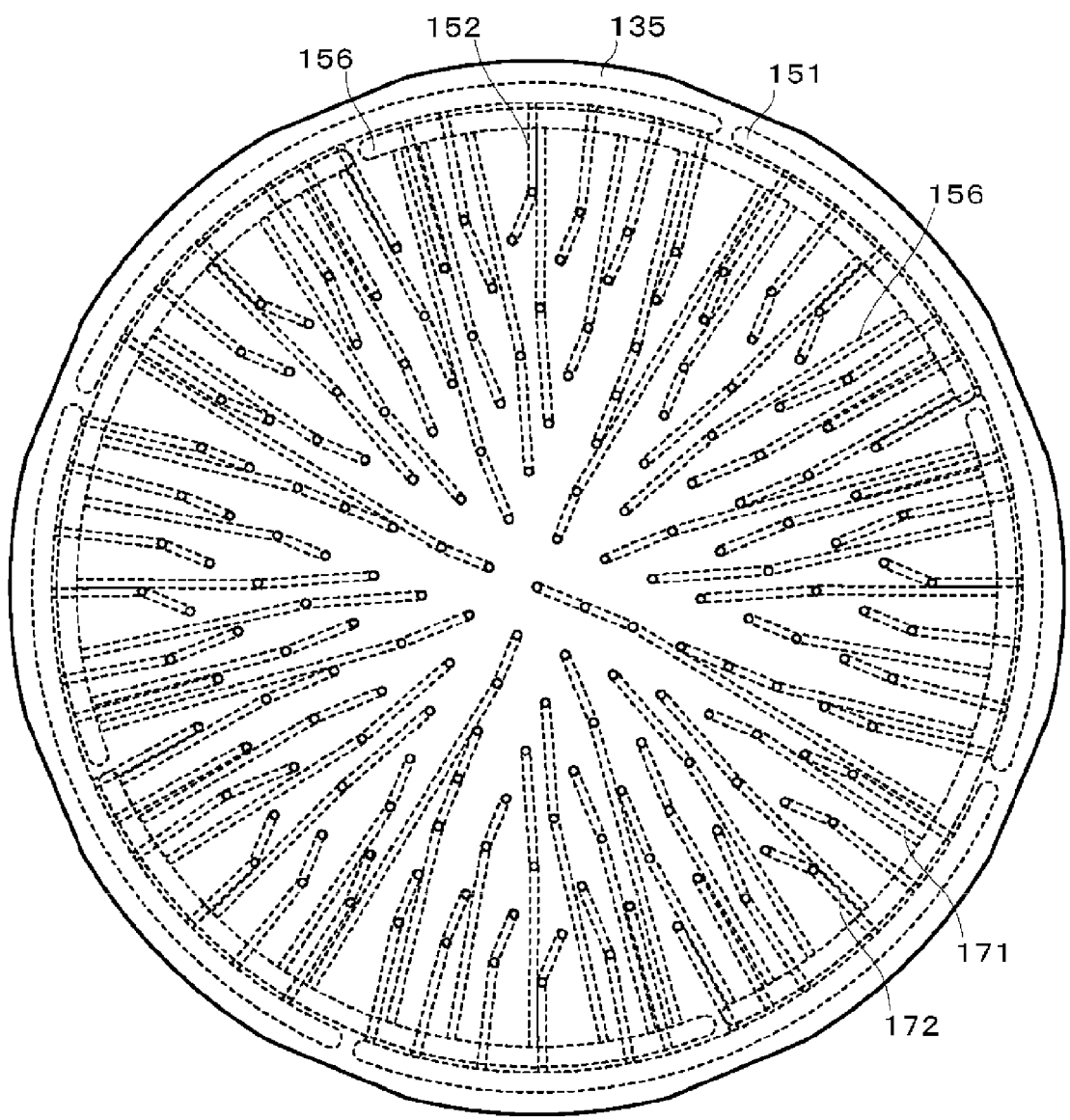
FIG. 13 illustrates a configuration of major parts of the plasma etching apparatus of FIGS. 9A and 9B.

The upper plate 131 is formed in a flat plate shape and fixed to the top surface of the intermediate plate 132, and the top side of the upper peripheral grooves 155, the upper diametrical grooves 156 and the intermediate through holes 150 are closed. Accordingly, groove-shaped gas channels 171 extended from the upper peripheral grooves 155 to the intermediate through holes 150 via the upper diametrical grooves 156 are formed as shown in FIG. 13.

Furthermore, the lower plate 133 is fixed to the bottom surface of the intermediate plate 132, and the bottom side of the lower peripheral grooves 151, the lower diametrical grooves 152 and the lower auxiliary grooves 153 are closed and the lower through holes 140 and the intermediate through holes 150 communicate with each other. Accordingly, groove-shaped gas channels 172 extended from the lower peripheral grooves 151 to the lower through holes 140 via the lower diametrical grooves 152 are formed as shown in FIG. 13.

Moreover, the upper plate 131, the intermediate plate 132 and the lower plate 133 can be joined by, e.g., diffusion joint or the like. In the diffusion joint, the plates are heated to a temperature of about 800° C. to 900° C. under, e.g., an oxygen atmosphere and pressed, so that joining can be performed without an adhesive layer.

As shown in FIG. 9A, the four gas inlet ports 155a for supplying the processing gas to the inner area of the substrate and the four gas inlet ports 151a for supplying the processing gas to the outer peripheral area of the substrate communicate with the processing gas inlet units 91 to 98, respectively.

The kinds and the flow rates of the processing gases introduced from the processing gas inlet units 91 to 98 may be different for the inner area and the outer peripheral area of the substrate, or may be different along a circumferential direction of the four processing gas inlet ports for the inner area and the four processing gas inlet ports for the outer peripheral area. Accordingly, plasma processing uniformity in a substrate surface can be finely controlled.

Furthermore, since the lower peripheral grooves 151 and the upper peripheral grooves 155 are divided, possibility of occurrence of electric discharge in these grooves may be reduced. That is, if the lower peripheral grooves 151 and the upper peripheral grooves 155 are not divided but a single groove is formed along the entire circumference, a potential difference may be generated in a groove-shaped gas channel formed by this groove and a possibility of occurrence of electric discharge may increase. In the fifth embodiment, however, such possibility of electric discharge can be reduced.

In the fifth embodiment configured as described above, the same effects as described in the above-mentioned embodiments can also be obtained. Further, a multiple number of lower through holes 140 serving as processing gas discharge openings can be arranged in a lattice shape. Accordingly, the processing gas supplied to the substrate can be more uniformized.

Figure 14:
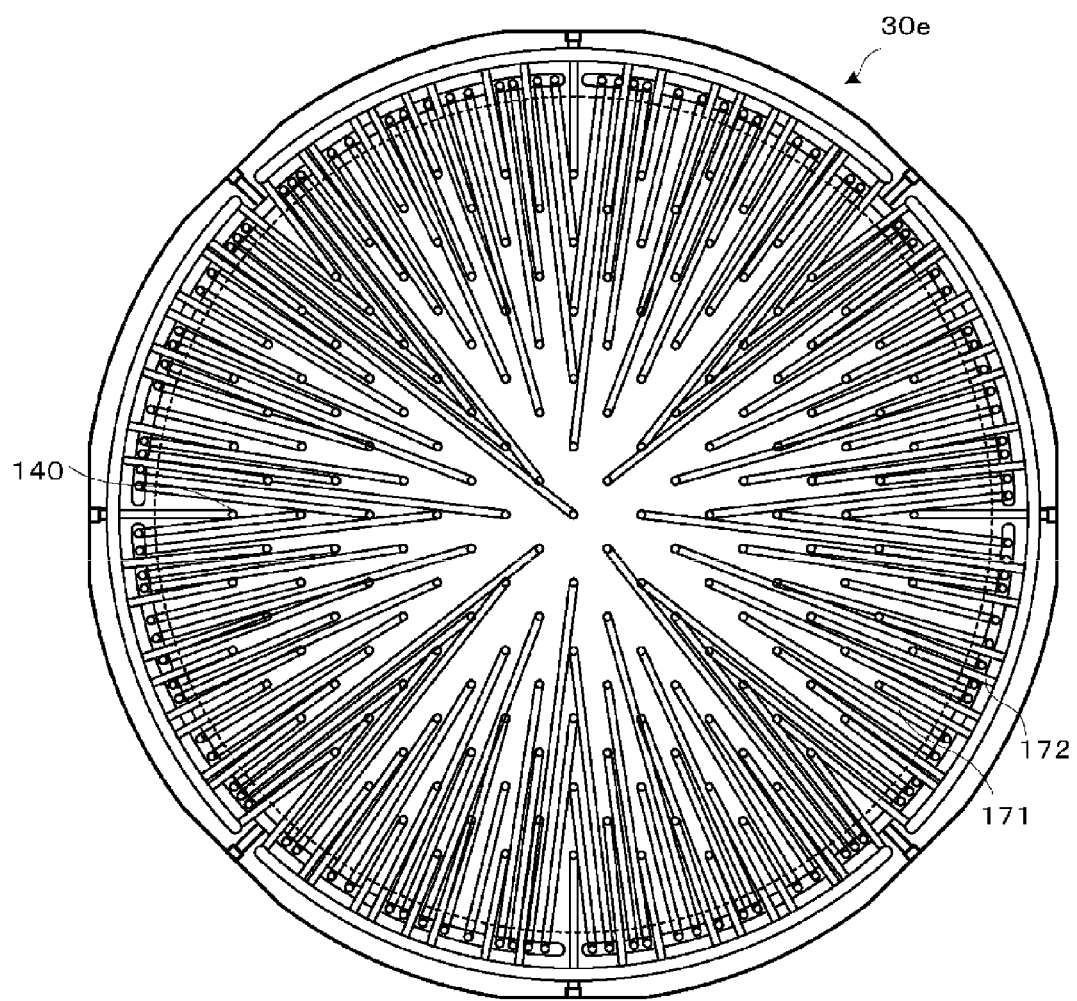
FIG. 14 illustrates a configuration of major parts of a plasma etching apparatus in accordance with a sixth embodiment of the present invention.

Moreover, in the fifth embodiment, the groove-shaped gas channels 171 and the groove-shaped gas channels 172 are curved, and the groove-shaped gas channels 171 and 172 are configured to correspond to the multiple number of lower through holes 140. However, as in a processing gas supply mechanism 30e in accordance with a sixth embodiment shown in FIG. 14, each of the groove-shaped gas channel 171 and the groove-shaped gas channel 172 may be formed to correspond to one lower through hole 140, and the groove-shaped gas channel 171 and the groove-shaped gas channel 172 may be formed in a straight line shape.

Furthermore, the processing gas supply mechanism 30d in accordance with the fifth embodiment and the processing gas supply mechanism 30e in accordance with the sixth embodiment are not limited to the ICP plasma processing apparatus but can be applied to a CCP plasma processing apparatus if the lower plate 133 or the like is made of silicon.

Moreover, the present invention is not limited to the above-described embodiments but can be modified in various ways. For example, the number of the plates constituting the layered body of the processing gas supply mechanism is not limited to three (3) or four (4), and two (2) or five (5) or more plates may be used. Furthermore, the shape of the through holes formed in the plate is not limited to a circular shape or an elliptical shape but can be other shapes. Further, the depth and the width of the groove-shaped gas channel may be changed depending on the length of the groove-shaped gas channel so as to obtain a uniform flow rate of the processing gas.

What is claimed is:

1. A plasma processing apparatus for generating inductively coupled plasma in a processing chamber and performing a process on a substrate accommodated in the processing chamber, the apparatus comprising:
    an upper cover installed to cover a top opening of the processing chamber and having a dielectric window;
    a high frequency coil installed above the dielectric window at an outer side of the processing chamber;
    a gas supply mechanism supported by the upper cover and installed under the dielectric window,
    wherein the gas supply mechanism comprises a layered body including a plurality of plates having through holes,
    the gas supply mechanism is configured to supply a processing gas into the processing chamber in a horizontal direction from a plurality of ports via a plurality of groove-shaped gas channels installed between the plates or between the plate and the dielectric window,
    end portions of the groove-shaped gas channels are opened to edges of the through holes, and
    each of the plates has an annular shape, and inner diameters of the plates having the annular shape decrease as the plates become closer to a side of the dielectric window.

2. The plasma processing apparatus of claim 1, wherein the plates are made of a dielectric material.

3. The plasma processing apparatus of claim 2, wherein the plates are made of quartz or ceramics.

4. The plasma processing apparatus of claim 1, wherein outer diameters of the plates increase as the plates become closer to a side of the dielectric window.

5. The plasma processing apparatus of claim 1, wherein the groove-shaped gas channels are installed so as to be perpendicular to the high frequency coil.

6. The plasma processing apparatus of claim 5, wherein a metal thin film is formed at a portion of the groove-shaped gas channel of the plate.

7. A processing gas supply structure of a plasma processing apparatus including an upper cover installed to cover a top opening of a processing chamber and having a dielectric window and a high frequency coil installed above the dielectric window at an outer side of the processing chamber and capable of generating inductively coupled plasma in the processing chamber by applying a high frequency power to the high frequency coil and performing a process on a substrate accommodated in the processing chamber, the structure comprising:

a layered body supported by the upper cover and installed under the dielectric window and including a plurality of plates having through holes, wherein a processing gas is supplied into the processing chamber in a horizontal direction from a plurality of ports via a plurality of groove-shaped gas channels installed between the plates or between the plate and the dielectric window, end portions of the groove-shaped gas channels are opened to edges of the through holes, and each of the plates has an annular shape, and inner diameters of the plates having the annular shape decrease as the plates become closer to a side of the dielectric window.

\* \* \* \* \*

UNITED STATES PATENT AND TRADEMARK OFFICE
CERTIFICATE OF CORRECTION

| | |
|---|---|
| PATENT NO. | : 8,674,607 B2 |
| APPLICATION NO. | : 13/115193 |
| DATED | : March 18, 2014 |
| INVENTOR(S) | : Hachishiro Iizuka |

It is certified that error appears in the above-identified patent and that said Letters Patent is hereby corrected as shown below:

In the Specification

Column 4, line 35, please replace "channels and" with - channels 51 and -

Signed and Sealed this
Tenth Day of June, 2014

Michelle K. Lee
*Deputy Director of the United States Patent and Trademark Office*